United States Patent [19]

Queinnec et al.

[11] Patent Number: 5,027,006
[45] Date of Patent: Jun. 25, 1991

[54] CIRCUIT FOR DETECTING A SUPPLY VOLTAGE DROP AND FOR RESETTING AN INITIALIZATION CIRCUIT

[75] Inventors: Olivier Queinnec; Henri Pouget, both of Grenoble, France

[73] Assignee: SGS-Thomson Microelectronics S.A., Gentilly, France

[21] Appl. No.: 452,824

[22] Filed: Dec. 21, 1989

[30] Foreign Application Priority Data

Dec. 22, 1988 [FR] France ................... 88 17364

[51] Int. Cl.⁵ ............... H03K 17/20; H03K 17/22; H03K 17/687; H03K 19/094
[52] U.S. Cl. ................ 307/272.3; 307/296.5; 307/594; 307/597
[58] Field of Search ............. 307/272.3, 592, 594, 307/597, 296.5, 603, 279

[56] References Cited

U.S. PATENT DOCUMENTS

| | | | |
|---|---|---|---|
| 4,001,609 | 1/1977 | Sickert | 307/268 |
| 4,142,118 | 2/1979 | Guritz | 307/358 |
| 4,317,180 | 2/1982 | Lies | 307/594 |
| 4,385,245 | 5/1983 | Ulmer | 307/597 |
| 4,405,871 | 9/1983 | Buurma et al. | 307/597 |
| 4,446,381 | 5/1984 | Dalrymple | 307/272.3 |
| 4,473,759 | 9/1984 | Mahabadi | 307/350 |
| 4,563,594 | 1/1986 | Koyama | 307/603 |
| 4,716,323 | 12/1987 | Wada et al. | 307/594 |
| 4,717,840 | 1/1980 | Ouyang et al. | 307/594 |
| 4,746,822 | 5/1988 | Mahoney | 307/597 |
| 4,797,585 | 1/1989 | Segawa et al. | 307/594 |
| 4,812,679 | 3/1989 | Mahabadi | 307/594 |
| 4,818,904 | 4/1989 | Kobayashi | 307/594 |
| 4,886,983 | 12/1989 | Taka | 307/272.3 |

FOREIGN PATENT DOCUMENTS

| | | | |
|---|---|---|---|
| 0127139 | 5/1984 | European Pat. Off. . | |
| 2449898 | 2/1979 | France . | |
| 0004616 | 1/1982 | Japan | 307/272.3 |
| 0048830 | 3/1982 | Japan | 307/272.3 |
| 0091029 | 6/1982 | Japan | 307/272.3 |
| 0183125 | 11/1982 | Japan | 307/272.3 |
| 0035345 | 9/1981 | United Kingdom | 307/272.3 |

Primary Examiner—Stanley D. Miller
Assistant Examiner—Toan Tran
Attorney, Agent, or Firm—Lowe, Price, LeBlanc, Becker & Shur

[57] ABSTRACT

A circuit detecting the drop of a supply voltage applied between a high voltage supply terminal and a low voltage supply terminal for an integrated circuit. A threshold circuit includes an input terminal connected to the high voltage supply terminal, an output terminal supplying a desired signal and threshold supply terminals. A MOS capacitor is connected between the low voltage supply terminal and an N-channel MOS transistor. The drain and gate of the transistor are connected together and to the high voltage supply terminal. The threshold supply terminals are connected across the capacitor.

4 Claims, 1 Drawing Sheet

CIRCUIT FOR DETECTING A SUPPLY VOLTAGE DROP AND FOR RESETTING AN INITIALIZATION CIRCUIT

BACKGROUND OF THE INVENTION

The present invention relates to a circuit for detecting a supply voltage drop and resetting an initialization circuit, implementable in a MOS-type integrated circuit without external components.

In a MOS-type logic intergrated circuit, it is necessary to provide, during the powering phase, for a circuit reinitialization. Numerous circuits have been devised for this aim. One drawback of those initialization circuits is that they cannot be re-operated after short supply drops, because of the capacitors they include or because of the parasitic capacitors associated thereto.

Consequently the aim of the invention is to provide for a particularly simple circuit for detecting a drop of the supply voltage applied to a MOS-type integrated circuit, this circuit being used for resetting an initialization circuit.

SUMMARY OF THE INVENTION

To achieve this object, the invention provides for a circuit detecting a supply voltage drop applied between a high supply terminal and a low supply terminal of an integrated circuit, comprising:

a threshold circuit comprising an input terminal connected to the high supply terminal, an output terminal supplying the desired signal, and supply input terminals, a MOS-type capacitor connected between said supply input terminals, the first terminal of which is connected to the low supply terminal, and an N-channel MOS transistor, the source of which is connected to the second terminal of said capacitor and the drain and gate of which are interconnected to the high supply terminal.

An advantage of this circuit is that it is particularly simple and has a small surface in the integrated circuit.

BRIEF DISCLOSURE OF THE DRAWINGS

The foregoing and other objects, features and advantages of the invention will be apparent from the following detailed description of a preferred embodiment as illustrated in the accompanying drawings wherein:

FIG. 1 illustrated an embodiment of a circuit according to the invention;

FIG. 2 shows the shape of the signals at various points of the circuit of FIG. 1; and FIG. 3 shows an application of the circuit according to the invention for resetting an intialization circuit.

DETAILED DESCRIPTION OF THE INVENTION

Figure 1:
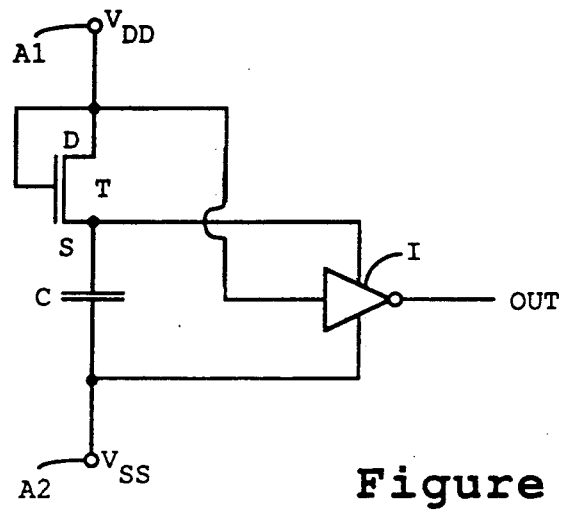

The circuit of FIG. 1 is fed between a high supply terminal A1 designed to receive a voltage $V_{DD}$ and a low supply terminal A2 at a voltage $V_{SS}$. For the sake of simplicity, it will be hereinunder assumed that $V_{SS}$ is equal to zero. Otherwise, it is merely necessary to everywhere replace $V_{DD}$ by $V_{DD}-V_{SS}$.

Between terminals A1 and A2 are serially connected an N-channel MOS transistor, T, and a MOS capacitor C. The drain of transistor T is connected to its gate and to terminal A1. An inverter I is fed across the terminals of capacitor C and receives on its input the voltage $V_{DD}$. The output of this inverter is labelled OUT.

Figure 2:
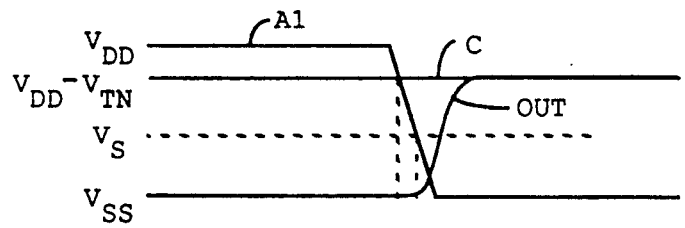

The operation of this circuit will be explained in relation with the waveforms of FIG. 2. In this figure, the voltage on the high supply terminal is labelled A1, the voltage across the capacitor terminals is labelled C and the output voltage is referenced OUT.

Considering a state where the voltage on terminal A1 is equal to $V_{DD}$, the voltage across the terminals of capacitor C will be $V_{DD}-V_{TN}$, $V_{TN}$ being the threshold voltage of the N-channel transistor. In this case, voltage OUT is equal to O ($V_{SS}$). If the voltage on terminal A1 drops, transistor T is blocked and voltage $V_{DD}-V_{TN}$ is stored across the terminals of capacitor C which is then slowly discharged in accordance with the junction current losses and which maintains the supply across the terminals of inverter I. Then, if the voltage on terminal A1 drops below the threshold value VS of inverter I, the output of this inverter changes its state and is set to its high value, substantially equal to $V_{DD}-V_{TN}$. An indication on the drop of voltage below the threshold voltage of inverter I is thus obtained at output OUT. Those skilled in the art will choose an inverter supplying the desired threshold voltage below which the supply voltage has become too low.

On the other hand, it will be noted that, for the sake of simplicity, the use of an inverter has been considered but any circuit exhibiting a change in state in response to the drop of its input voltage below a threshold level will be suitable.

Figure 3:
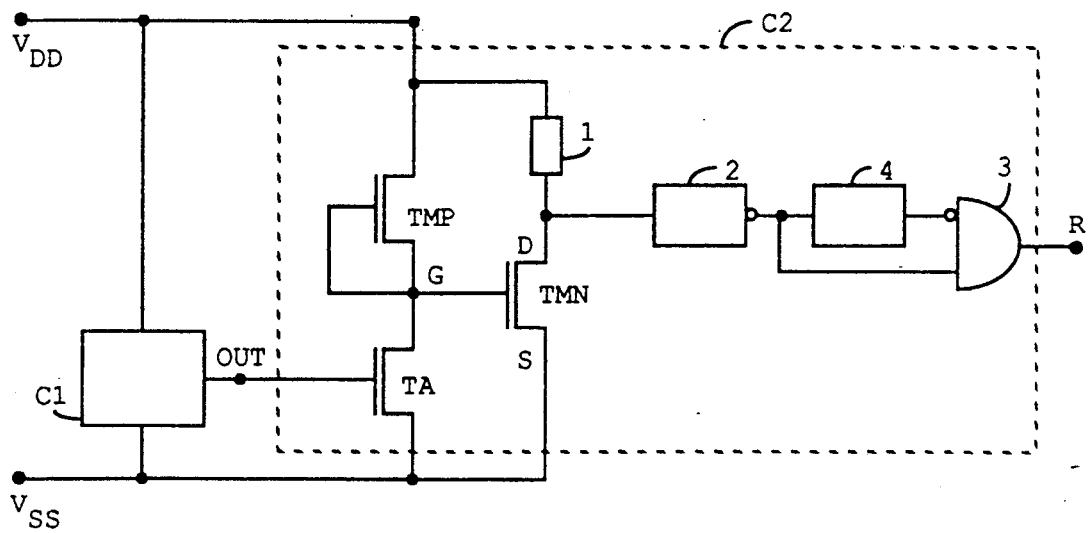

FIG. 3 shows an embodiment of the circuit according to the invention for resetting an initialization circuit. The circuit according to the invention is referenced C1 and the initialization circuit is referenced C2. The output OUT of circuit C1, corresponding to the output OUT of FIG. 1, is connected to the resetting input of circuit C2.

Inside block C2, an exemplary reinitialization circuit has been represented. Circuit C2 comprises an N-type MOS transistor TMN, the drain of which is connected to terminal $V_{DD}$ through an impedance 1, the gate G of which is connected to the gate and drain of a P-channel MOS transistor TMP. The source of transistor TMP is connected to $V_{DD}$ and the source of transistor TMN is connected to $V_{SS}$. Moreover, means connected to the drain of transistor TMN are provided for shaping and detecting the output of the initialization circuit and comprise a shaping inverter 2, the output of which is sent, on the one hand, to a non-inverting input of an AND gate 3 and, on the other hand, to an inverting input of this AND gate through a delay circuit 4. Output R of the AND gate 3 constitutes the reinitialization signal.

Circuit C2 permits detection of the transition of voltage $V_{DD}$ above a given threshold equal to the threshold of transistor TMP plus the threshold of transistor TMN. However, if the voltage drops, this circuit is discharged very slowly and no reinitialization signal is emitted when the supply voltage is rising again.

The invention further provides a resetting circuit TA, which is an N-channel MOS transistor, the drain of which is connected to terminal G and the source to $V_{SS}$. The gate of transistor TA receives signal OUT. Thus, when signal OUT is at low level, this transistor is blocked and circuit 2 normally operates. However, as soon as the voltage drops and a signal OUT is supplied, transistor TA becomes conductive and resets the gate voltage of transistor TMP and TMN to low level, permitting to subsequently detect again an increase in voltage $V_{DD}$, this new increase of $V_{DD}$ resetting signal OUT to low level.

Of course, the invention is liable of numerous variants and modifications which will clearly appear to those skilled in the art. Especially, if the respective polarities of voltages $V_{DD}$ and $V_{SS}$ are reversed, it will be necessary to modify all the MOS transistor types so as to allow the circuit to correspondingly operate.

We claim:

1. A circuit for detecting a voltage drop of an integrated circuit supply voltage supplied between a high voltage supply terminal and a low voltage supply terminal, comprising:
    a threshold circuit comprising an input terminal connected to the high voltage supply terminal, an output terminal, and threshold circuit supply terminals,
    a MOS capacitor having first and second terminals connected across said threshold circuit supply terminals, said first terminal being connected to the low voltage supply terminal, and
    an N-channel MOS transistor, having a source connected to said second terminal of said capacitor and having a drain and gate interconnected to each other and to the high voltage supply terminal.

2. A detection circuit according to claim 1 wherein said threshold circuit comprises an inverter.

3. A detecting circuit according to claim 1 wherein said output terminal is connected to an initialization circuit for resetting said initialization circuit while powering a MOS integrated circuit.

4. A detection circuit according to claim 3 wherein said initialization circuit comprises a second N-channel MOS transistor having a source connected to the low voltage supply terminal, a drain connected to the high voltage supply terminal through an impedance and to an output terminal, and a gate connected to the gate/drain connection of a P-channel MOS transistor, the source of said P-channel MOS transistor being connected to the high voltage supply terminal, and further comprising:
    means for shorting the gate and the source of said second N-channel MOS transistor in response to a signal at said output terminal.

* * * * *